United States Patent [19]
Hashimoto

[11] Patent Number: 5,994,190
[45] Date of Patent: Nov. 30, 1999

[54] SEMICONDUCTOR DEVICE WITH IMPURITY LAYER AS CHANNEL STOPPER IMMEDIATELY UNDER SILICON OXIDE FILM

[75] Inventor: Shingo Hashimoto, Tokyo, Japan

[73] Assignee: NEC Corporation, Tokyo, Japan

[21] Appl. No.: 09/150,710

[22] Filed: Sep. 10, 1998

Related U.S. Application Data

[62] Division of application No. 08/768,659, Dec. 18, 1996, abandoned.

[30]     Foreign Application Priority Data

Dec. 18, 1995  [JP]  Japan ................................. 7-329310

[51] Int. Cl.$^6$ .................................................. H01L 21/336
[52] U.S. Cl. .......................... 438/298; 438/217; 438/225; 438/289; 438/448; 438/450; 438/220
[58] Field of Search ...................................... 438/199, 217, 438/218, 225, 289, 298, 297, 450, 448, 220, FOR 205

[56]            References Cited

U.S. PATENT DOCUMENTS 5,344,787  9/1994  Nagalingam et al. .................... 437/35
5,378,650  1/1995  Kimura ..................................... 437/63
5,484,742  1/1996  Urai ......................................... 437/44
5,556,798  9/1996  Hong ....................................... 437/43
5,599,731  2/1997  Park ...................................... 438/448
5,633,191  5/1997  Chao ..................................... 438/448
5,747,372  5/1998  Lim ....................................... 438/289
5,786,265  7/1998  Hwang et al. ......................... 438/450

FOREIGN PATENT DOCUMENTS 4-290269  10/1992  Japan .
6-163844   6/1994  Japan .

Primary Examiner—Wael M. Fahmy
Assistant Examiner—Long Pham

[57]              ABSTRACT

A semiconductor device includes a first conductivity type low concentration impurity layer provided around a thick silicon oxide film, which is formed for element isolation in a first conductivity type element region as a surface region in a semiconductor substrate, and a second conductivity type impurity layer which is provided immediately under at least the thick silicon oxide film. The second conductivity type impurity layer constitutes a channel stopper to enhance the effect of element isolation. The first conductivity type low concentration impurity layer has an effect of improving the P-N junction breakdown voltage of an active region in the first conductivity type element region, and suppresses the narrow channel effect of a MOS transistor in the first conductivity type element region.

3 Claims, 5 Drawing Sheets

N-CHANNEL REGION    P-CHANNEL REGION

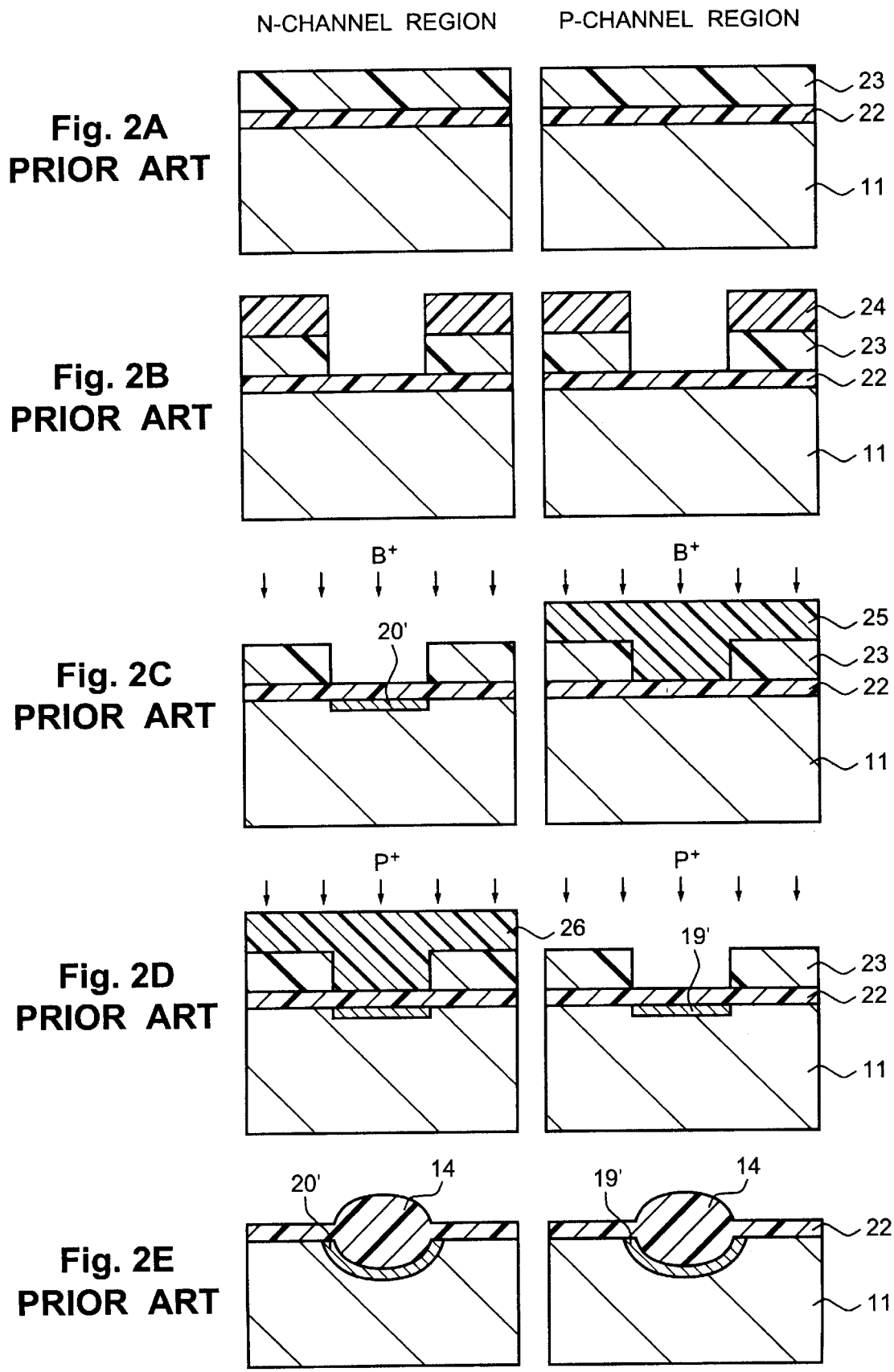

N-CHANNEL REGION     P-CHANNEL REGION

Fig. 6C 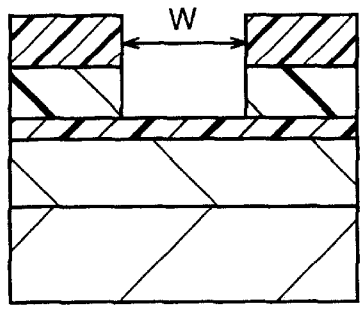 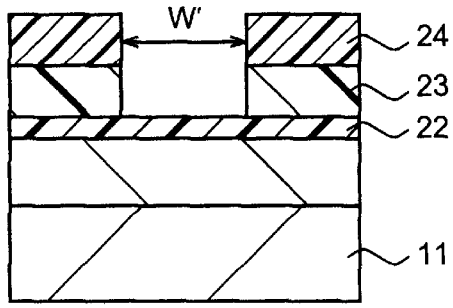
Fig. 6D 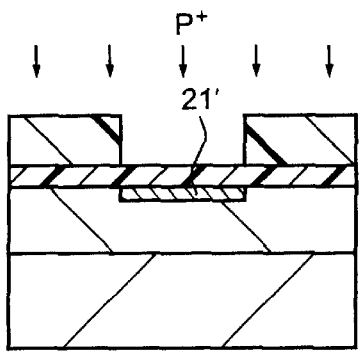 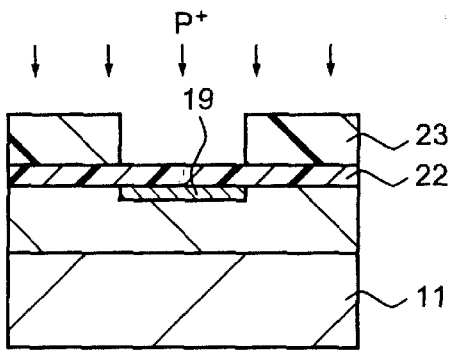
Fig. 6E 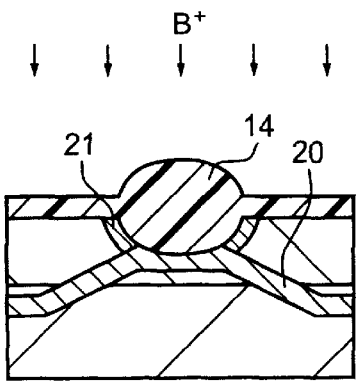 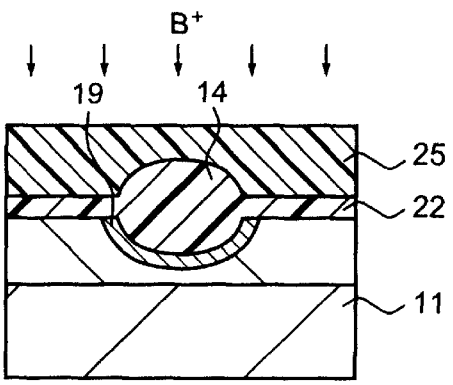

SEMICONDUCTOR DEVICE WITH IMPURITY LAYER AS CHANNEL STOPPER IMMEDIATELY UNDER SILICON OXIDE FILM

This is a divisional application of Ser. No. 08/768,659, filed Dec. 18, 1996, now abandoned.

BACKGROUND OF THE INVENTION (1) Field of the Invention

The present invention relates to semiconductor devices such as BiCMOSs and CMOSs having integral P- and N-type elements, and more particularly to a structure of an element isolation region which isolates the elements from one another as well as a method for fabricating the same.

(2) Description of the Related Art

With a recent trend of making semiconductor devices further miniaturized in the structure and higher in the integration density, there is a need of miniaturizing the structure of the element isolation region that electrically isolates elements from one another. Such an element isolation region is constituted by, for instance, a selective oxide film (or field oxide film) which is fabricated by an LOCOS process and, to reinforce the element isolation performance of the field oxide film, a channel stopper is formed thereunder by introducing an impurity. FIGS. 1A to 1D illustrate step by step a prior art process of fabricating such an element isolation region, a P- and an N-channel region being shown separately.

As shown in FIG. 1A, on a semiconductor substrate 11 which has a predetermined semiconductor surface region formed on the principal surface side, a first silicon oxide film 22 is formed, and a silicon nitride film 23 is formed thereon. As shown in FIG. 1B, with a first resist pattern 24 formed by a lithographic process as a mask, a portion of the silicon nitride film 23 which is in an element isolation formation region is removed until the first silicon oxide film 22 or the semiconductor substrate 11 is exposed.

Next, as shown in FIG. 1C, the first resist pattern 24 is removed. Then, a second resist pattern 25 is formed to cover the P-channel region, and a P-type impurity layer 20' is formed as a channel stopper in the N-channel region by ion implanting a P-type impurity such as boron. As shown in FIG. 1D, the second resist pattern 25 is subsequently removed, and a second silicon oxide film (or field oxide film) 14 is formed by oxidation for element isolation. Finally, the silicon nitride film 23 is removed.

In this element isolation structure, no impurity for the channel stopper is doped immediately under the field oxide film 14 for the P-channel region element isolation. Therefore, to obtain the desired element isolation effect, it is necessary to increase the width or thickness dimension of the field oxide film. Thus, it is difficult to make the element isolation region finer as compared to the channel region.

It has been proposed to improve the element isolation with respect to the P-channel region by implanting an impurity for the N-channel stopper immediately under the field oxide film in the P-channel region as well. FIGS. 2A to 2E illustrate step by step a fabrication process in this case. As shown in FIG. 2A, on a semiconductor substrate 11, a first silicon oxide film 22 is formed, and a silicon nitride film 23 is formed thereon. As shown in FIG. 2B, with a first resist pattern 24 formed as a mask by a lithographic process, a portion of the silicon nitride film 23 in the element isolation formation region is removed until the first silicon oxide film 22 or the semiconductor substrate 11 is exposed.

Next, as shown in FIG. 2C, the first resist pattern 24 is removed. Then, a second resist pattern 25 is formed to cover the P-channel region, and a P-type impurity layer 20' is formed as a channel stopper in the N-channel region by ion implanting a P-type impurity such as boron in a portion at which the second resist pattern 25 does not exist. As shown in FIG. 2D, the second resist pattern 25 is subsequently removed. Then, a third resist pattern 26 covering the N-channel region is formed, and an N-type impurity layer 19' is formed as a channel stopper of the P-channel region by ion implanting an N-type impurity such as boron in a portion at which the third resist pattern 26 does not exist. As shown in FIG. 2E, the third resist pattern 26 is subsequently removed, and a second silicon oxide film (or field oxide film) 14 is formed by oxidation for element isolation. Finally, the silicon nitride film 23 is removed.

As shown above, it is possible to realize a finer isolation element with respect to the individual channel regions by forming the channel stoppers immediately under the field oxide film in the respective P- and N-channel regions. However, to fabricate this structure, it is necessary to form resist patterns each for the ion implantation of impurity in each channel region, thus increasing the number of steps and the fabrication cost.

Another problem is posed by the fact that, since the channel stoppers, which are formed immediately under the field oxide film in the respective channel regions, are of relatively high impurity concentration, active layers formed by an impurity of the opposite conductivity type in each channel region, for instance, source and drain regions of a MOS transistor, may happen to be in direct contact with the channel stoppers. As an example, in the case of the example shown in FIG. 3, a P-type impurity layer 20' is formed as the channel stopper immediately under a field oxide film 14 in a P-channel region such that it is in contact with an N-type diffusion layer 18 which constitutes the source and drain of an N-type MOS transistor. A P-N junction that is formed between these two high impurity concentration impurity layers, is subject to P-N junction breakdown voltage deterioration. Besides, the impurity in the N-type diffusion layer 18 is diffused laterally by a heat treatment during the fabrication process. As a consequence, a pronounced MOS transistor narrow channel effect appears and results in deterioration of the transistor characteristics.

SUMMARY OF THE INVENTION

An object of the invention, therefore, is to overcome the problems existing in the prior art, and to provide a semiconductor device, which has an element isolation structure having an improved P-N junction breakdown voltage and no deteriorating transistor characteristics, and a method for fabricating a semiconductor device which can be carried out without increasing the fabrication steps.

According to one aspect of the invention, there is provided a semiconductor device which comprises a thick silicon oxide film formed for element isolation in a first conductivity type element region formed as a principal surface region in a semiconductor substrate, a first conductivity type low concentration impurity layer formed around the thick silicon oxide film, and a second conductivity type impurity layer formed immediately under at least the thick silicon oxide film. The second conductivity type impurity layer may be formed in the entire surface of the first conductivity type element region. Also, a first conductivity type diffusion layer formed in the first conductivity type element region may be in contact with the first conductivity type low concentration impurity layer.

A method for fabricating a semiconductor device according to the invention comprises a step of selectively ion implanting a first conductivity type impurity into a surface region of a semiconductor substrate constituting an element isolation region, a step of forming a thick oxide film for element isolation in the ion implanted surface region by using a selective oxidation process, and a step of ion implanting a second conductivity type impurity into a first conductivity type element region at an impurity concentration sufficient to invert the conductivity type of the region doped with the first conductivity type impurity and with an energy sufficient to cause the ion implantation to penetrate the thick silicon oxide film by masking a second conductivity type element region.

Either of the first and second conductivity type may be P- or N-type. The second conductivity type impurity layer formed in the first conductivity type element region need be present immediately under at least the thick silicon oxide film, and need not be formed over the entire first conductivity type impurity region. The impurity concentrations of the ion implanted first and second conductivity type impurities are preferably set to high impurity concentrations in ranges which are required for a channel stopper for enhancing the element isolation characteristics.

BRIEF DESCRIPTION OF THE DRAWINGS

The above and other objects, features and advantages of the present invention will be apparent from the following description of a preferred embodiment of the invention explained with reference to the accompanying drawings, in which:

FIGS. 2A to 2E are sectional views illustrating step by step a different prior art method for fabrication;

FIGS. 6A to 6E ate sectional views illustrating step by step a process of fabricating an element isolation structure in the semiconductor device shown in FIG. 5.

PREFERRED EMBODIMENT OF THE INVENTION

Figure 5:
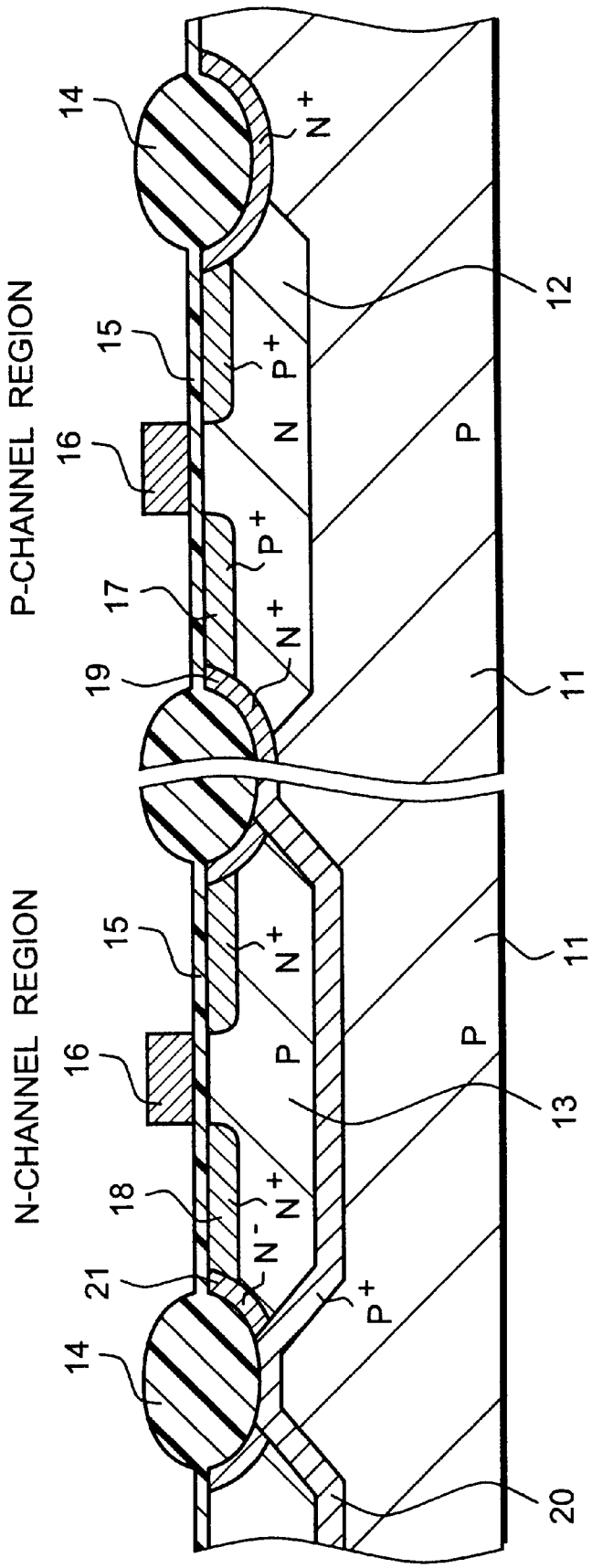
FIG. 5 is a fragmentary sectional view showing a semiconductor device embodying the invention.

An embodiment of the invention will now be described with reference to the drawings. FIG. 5 shows a CMOS semiconductor device embodying the invention, which has MOS transistors each formed in a P- and an N-channel region. In the P-channel region, an element region is defined by an N-well 12 formed as a surface layer in a semiconductor substrate 11 and a field oxide film 14. Formed in this element region are a gate oxide film 15, a gate electrode 16 and a P-type diffusion layer 17 constituting source and drain regions. In the N-channel region, an element region is defined by a P-well 13 formed as a surface layer in the semiconductor substrate 11 and the field oxide film 14. Formed in this element region are a gate oxide film 15, a gate electrode 16 and an N-type diffusion layer 18 constituting source and drain regions.

An N-type impurity layer 19 is formed as a channel stopper immediately under the field oxide film 14 in the P-channel region. A P-type impurity layer 20 is formed immediately under the field oxide layer 14 in the N-channel region, and a low concentration N-type impurity layer 21 is formed in a region between the P-type impurity layer 20 and the substrate surface. The N-type diffusion layer 18 of the MOS transistor formed in the N-channel region is in contact with the low concentration N-type impurity layer 21. The P-type impurity layer 20 is formed in the semiconductor substrate at a relatively deep position thereof in an active region of the P-channel region.

Figure 6A:
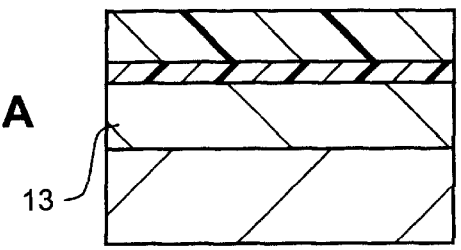

The process of fabricating the semiconductor device shown in FIG. 5, particularly the process of forming the element isolation region, will now be described step by step with reference to the sectional views of FIGS. 6A to 6E. As shown in FIG. 6A, a first silicon oxide film 22 having a thickness of about 5 to 40 nm, which will become the gate oxide film 15, is formed by a thin thermal oxidation at semiconductor regions of predetermined conductivity types, that is, a surface portion of the semiconductor substrate 11 on which the P-well 13 and the N-well 12 are formed, and then a first silicon nitride film 23 is deposited to a thickness of about 100 to 400 nm by a reduced pressure CVD process (reduced pressure chemical vapor deposition process). Alternatively, after the silicon oxide film formation, polycrystalline silicon (not shown) may be deposited to form a lamination before the silicon nitride film deposition.

Figure 6B:
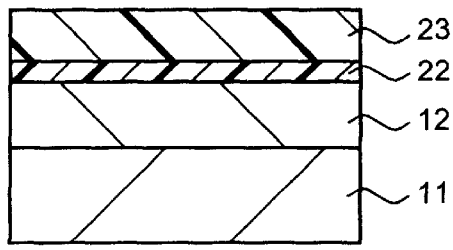

Next, as shown in FIG. 6B, a first resist pattern 24 which defines an element isolation region is formed by a lithographic technique. The first resist pattern 24 has opening with widths W and W' which define the widths of corresponding portions of the element isolation region. With the first resist pattern 24 used as an etching mask, the first silicon nitride film 23 is etched by anisotropic etching until the first silicon oxide film 22 is completely exposed. While in this embodiment the etching is ended at the interface between the first silicon nitride film 23 and the first silicon oxide film 22, it is also possible to etch the first silicon oxide film 22 to expose the semiconductor substrate 11. Where polycrystalline silicon is deposited as mentioned above, the first silicon nitride film 23 is removed by anisotropic etching with the first resist pattern 24 used as etching mask until the polycrystalline silicon is completely exposed or until the first silicon oxide film 22 or the semiconductor substrate 11 is exposed.

As shown in FIG. 6C, after the removal of the first resist pattern 24, an N-type impurity such as phosphorus or arsenic is ion implanted at a concentration of $10^{12}$ to $10^{13}$ cm$^{-2}$ into the semiconductor substrate 11 from the principal surface thereof. Then, N-type impurity layers 19 and 20' are formed. To ensure that the ion implantation does not penetrate regions other than the element isolation region, the accelerating energy was selected to be between 30 to 100 keV. The N-type impurity which is ion implanted into the P-channel region at this time provides an effect of improving the element separation with respect to the P-channel region.

As shown in FIG. 6D, the field oxide film 14 is then formed as a thick oxide film (of about 300 to 700 nm in thickness) in a portion of the semiconductor substrate 11 which will become the element isolation region by oxidizing a principal surface portion of the semiconductor substrate 11. Subsequently, the silicon nitride film 23 is removed, whereby the active region and the element isolation region are separated from each other. At this time, the N-type impurity layer 19 is formed under the field oxide film 14 in the P-channel region, thus completing the element isolation with respect to this region. The N-type impurity layer 21' is also formed under the field oxide layer 14 in the N-channel region. Where the polycrystalline silicon is deposited as mentioned above, the removal of the silicon nitride film 23 and the subsequent removal of the polycrystalline silicon results in the separation into the active region and the element isolation region.

As shown in FIG. 6E, a second resist pattern 25 is then formed by a lithographic process such that it covers the P-channel region or a region necessary therefor. It is possible to carry out well formation, transistor threshold adjustment ion implantation, etc. by using this resist pattern as a mask. Subsequently, in the N-channel region, a P-type impurity such as boron is ion implanted through the field oxide film 14 by a high energy ion implantation process. As conditions of this ion implantation, the ion implantation energy is such that the ion implantation sufficiently penetrates the field oxide film 14, and that the ion implantation impurity concentration surpasses the impurity concentration of the ion implanted to form the N-type impurity layer 21' in the step shown in FIG. 6C so that it can invert the conductivity type of this N-type impurity layer from N-type to P-type.

Figure 1A:
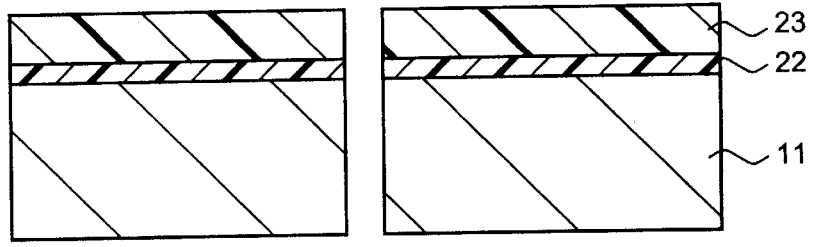
FIGS. 1A to 1D are sectional views illustrating step by step a prior art method for fabrication.
Figure 1B:
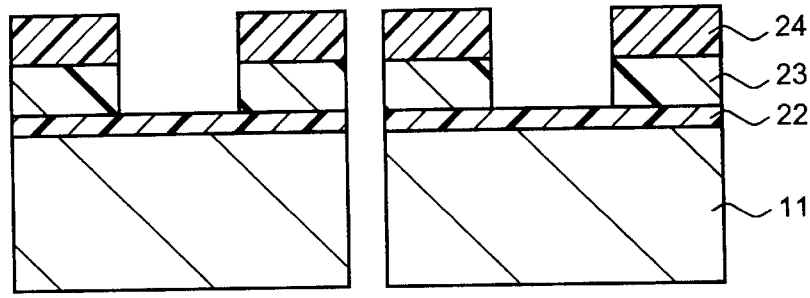
Figure 1C:
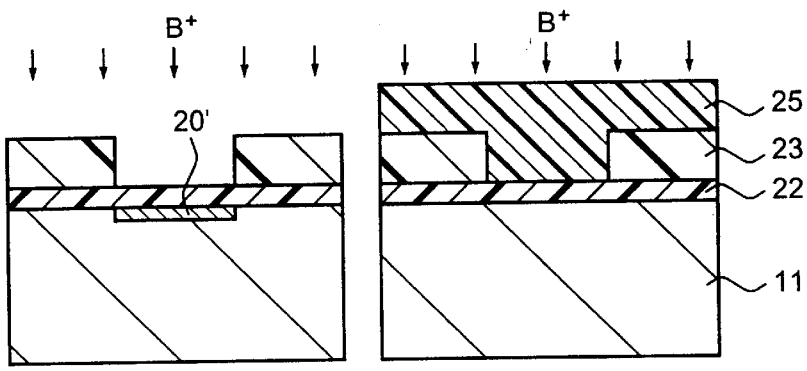
Figure 1D:
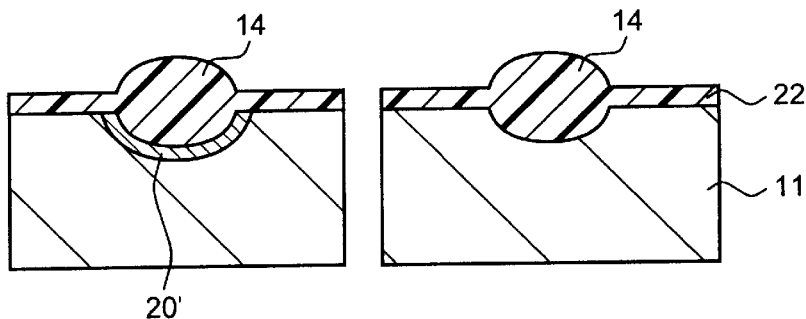
Figure 3:
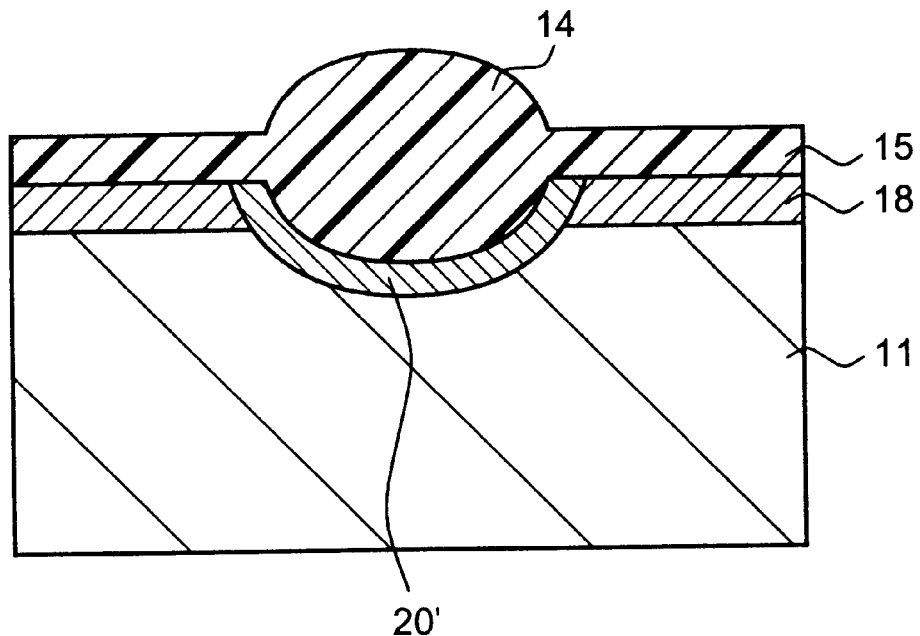
FIG. 3 is an enlarged-scale sectional view showing element isolation structure in the prior art.
Figure 4:
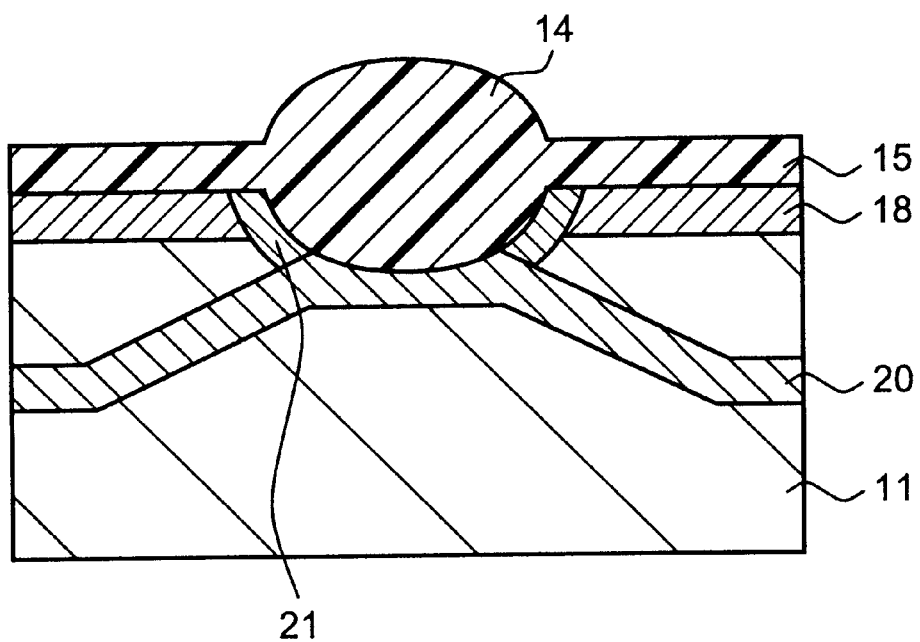
FIG. 4 is an enlarged-scale sectional view showing element isolation structure according to the invention.

Thus, the element isolation region formed in this process is the same as the element isolation region shown in FIG. 5 insofar as the P-channel region is concerned, in which the N-type impurity layer 19 is formed as the channel stopper immediately under the field oxide film 14. In the N-channel region, on the other hand, is dependent on the shape of the field oxide film 14 because the ion implantation of the P-type impurity is carried out by the high energy ion implantation process. As shown in FIG. 4, specifically this region has the P-type impurity layer 20 having a high impurity concentration, which is formed immediately under a central portion of the field oxide film 14 as a result of the conductivity type inversion of the N-type impurity layer 21' by the earlier ion implantation, and the N-type impurity layer 21 having a low impurity concentration, which is formed immediately under an edge portion of the field oxide film 14 around the P-type impurity layer 20 as a result of slight impurity concentration reduction by P-type impurity.

A channel stopper is formed of a P-type impurity layer, and the element isolation with respect to the N-channel region is thus improved compared to the structure having no channel stopper immediately under the field oxide film, that is, it is possible to obtain the same degree of element isolation as that obtained with the element isolation structure illustrated in FIGS. 2A to 2E. In addition, since the N-type diffusion layer 18 of the MOS transistor formed in the N-channel region is in contact with the low concentration N-type impurity layer 21, the impurity concentration gradient of the P-N junction in the N-channel active region is made gentler, thus improving the P-N junction breakdown voltage. A further advantage is that the low concentration N-type impurity layer 21 prevents the P-type impurity layer from spreading into the N-channel active region, that is, the effective active region is not made narrower, and the narrow channel effect can be suppressed.

In the above embodiment, after the ion implantation of the N-type impurity, a P-type impurity is ion implanted into the P-channel region to invert the conductivity type of the impurity formed immediately under the field oxide film in the N-channel region. Alternatively, it is possible to ion implant the P-type impurity and then ion implant the N-type impurity into the P-channel region for the conductivity type inversion of the impurity immediately under the field oxide film in the P-channel region. In this case, the element isolation structure is the same as the structure shown in FIG. 4 with respect to the P-channel region, although it is opposite in the conductivity type. This element isolation structure also has a low concentration P-type impurity layer.

As has been described in the foregoing, a first conductivity type low concentration impurity layer is formed around a thick silicon oxide film, which is formed for element isolation in a first conductivity type element region as a principal surface region in a semiconductor substrate, and a second conductivity type impurity layer is formed immediately under at least the thick silicon oxide film. The second conductivity type impurity layer constitutes a channel stopper to reinforce the element isolation effect, and the first conductivity type low concentration impurity layer improves the P-N junction breakdown voltage in an active region of the first conductivity type element region, as well as suppressing the narrow channel effect of the MOS transistor in the first conductivity type element region.

In addition, in the method of fabrication according to the invention, a first conductivity type impurity is ion implanted into only the first conductivity type element region after a second conductivity type impurity has been ion implanted into the individual conductivity type element region in the semiconductor substrate. It is thus possible to obtain the element isolation structure according to the invention without complication of the fabrication process, that is, by adopting the same resist process as in fabricating the prior art element isolation structure, in which a channel stopper is formed in only one of the two different conductivity type element regions.

While the invention has been described in its preferred embodiments, it is to be understood that the words which have been used are words of description rather than limitation and that changes within the purview of the appended claims may be made without departing from the true scope of the invention as defined by the claims.

What is claimed is:

1. A method for fabricating a semiconductor device having a first and a second conductivity type element region, said method comprising the steps of:
   selectively ion implanting a first conductivity type impurity into a surface region of a first conductivity type in a semiconductor substrate constituting an element isolation region;
   forming a thick silicon oxide film for element isolation in the ion implanted surface region by a selective oxidation process; and
   ion implanting a second conductivity type impurity into said first conductivity type element region at an impurity concentration sufficient to invert the conductivity type of said first conductivity type impurity and with an energy capable of causing the ion implantation to penetrate said thick silicon oxide film after masking said second conductivity type element region.

2. A method for fabricating a semiconductor device having a first and a second conductivity type element region, said method comprising the steps of:
   forming a lamination of a first silicon oxide film and a silicon nitride film on a principal surface of a semiconductor substrate;
   removing a portion of said silicon nitride film that is at an element isolation formation region;
   ion implanting a first conductivity type impurity into said semiconductor substrate with said silicon nitride film used as a mask;
   selectively forming a thick second silicon oxide film on a surface of said semiconductor substrate by thermal oxidation with said silicon nitride film used as a mask;

removing a remaining portion of said silicon nitride film;

covering regions other than said first conductivity type element region with a resist; and ion implanting a second conductivity type impurity into said first conductivity type element region at an impurity concentration sufficient to invert the conductivity type of said first conductivity type impurity and with an energy sufficient for the ion implantation to penetrate said thick second silicon oxide film.

3. A method for fabricating a semiconductor device according to claim 2, in which said lamination further comprises a polycrystalline silicon film interposed between said first silicon oxide film and said silicon nitride film, and in which said step of removing said remaining portion of said silicon nitride film further comprises a step of removing said polycrystalline silicon film.

* * * * *